(12) United States Patent
Yang et al.

(10) Patent No.: US 11,029,598 B2
(45) Date of Patent: Jun. 8, 2021

(54) PHOTOSENSITIVE POLYIMIDE COMPOSITION AND PHOTORESIST FILM MADE THEREOF

(71) Applicant: eChem Solutions Corp., Taoyuan (TW)

(72) Inventors: Tz Jin Yang, Taoyuan (TW); Ming Che Chung, Taoyuan (TW)

(73) Assignee: eChem Solutions Corp., Taoyuan (TW)

( * ) Notice: Subject to any disclaimer, the term of this patent is extended or adjusted under 35 U.S.C. 154(b) by 173 days.

(21) Appl. No.: 16/119,464

(22) Filed: Aug. 31, 2018

(65) Prior Publication Data

US 2019/0243241 A1 Aug. 8, 2019

(30) Foreign Application Priority Data

Feb. 2, 2018 (TW) .................................. 107103882

(51) Int. Cl.
| | | |
|---|---|---|
| *G03F 7/20* | (2006.01) | |
| *G03F 7/023* | (2006.01) | |
| *G03F 7/039* | (2006.01) | |
| *G03F 7/004* | (2006.01) | |
| *C08G 73/10* | (2006.01) | |
| *G03F 7/38* | (2006.01) | |
| *G03F 7/26* | (2006.01) | |
| *G03F 7/16* | (2006.01) | |
| *G03F 7/075* | (2006.01) | |
| *G03F 7/022* | (2006.01) | |

(52) U.S. Cl.
CPC ....... *G03F 7/0233* (2013.01); *C08G 73/1046* (2013.01); *G03F 7/0045* (2013.01); *G03F 7/0226* (2013.01); *G03F 7/039* (2013.01); *G03F 7/0757* (2013.01); *G03F 7/16* (2013.01); *G03F 7/168* (2013.01); *G03F 7/20* (2013.01); *G03F 7/26* (2013.01); *G03F 7/38* (2013.01)

(58) Field of Classification Search
CPC ....................................................... G03F 7/00
See application file for complete search history.

(56) References Cited

U.S. PATENT DOCUMENTS

| | | | | |
|---|---|---|---|---|
| 2005/0282958 A1* | 12/2005 | Jeng | .......................... | C08K 5/42 524/606 |
| 2010/0196822 A1* | 8/2010 | Sasaki | ................... | G03F 7/0233 430/280.1 |
| 2013/0034812 A1* | 2/2013 | Shimada | ................. | G03F 7/027 430/280.1 |

\* cited by examiner

*Primary Examiner* — Chanceity N Robinson

(57) ABSTRACT

The present invention provides a photosensitive polyimide composition comprising a polyimide resin having a structural unit represented by the formula (1) and a structural unit represented by the formula (2), a quinonediazide sulfonate, a thermal curing agent, and a thermal acid generator.

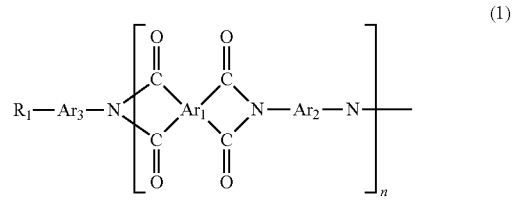

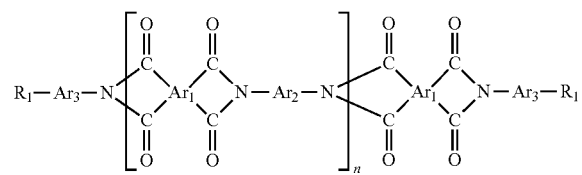

In the formulas (1) and (2), n is an integer of 10 to 600, $Ar_1$ is a tetravalent organic group; $Ar_2$ is a divalent to tetravalent organic group; $Ar_3$ is a divalent aromatic group; and $R_1$ is an OH group or a COOH group. The present invention also provides a photoresist film made of the above-mentioned photosensitive polyimide composition.

8 Claims, No Drawings

PHOTOSENSITIVE POLYIMIDE COMPOSITION AND PHOTORESIST FILM MADE THEREOF

FIELD OF THE INVENTION

The invention relates to photosensitive resin compositions, and more particularly to photosensitive polyimide (PSPI) compositions for forming insulating or passivation layers for manufacturing semiconductor devices.

BACKGROUND OF THE INVENTION

Photosensitive polyimide resins are excellent in heat resistance and mechanical properties, and have excellent dimensional stability. They are commonly used in electrical insulating materials such as heat-resistant coating materials, insulating materials for printed circuit boards, and semiconductor insulating materials. However, the conventional polyimide resin is not chemically resistant, so when it is used as an insulating layer in a semiconductor process, it is often damaged by the acid/alkaline environment of the subsequent process.

The information disclosed in this "BACKGROUND OF THE INVENTION" Section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention was acknowledged by a person of ordinary skill in the art.

SUMMARY OF THE INVENTION

One of the objects of the present invention is to provide a photosensitive resin composition that has not only heat resistance but also good chemical resistance after hard-baking to improve the above-described disadvantages of the polyimide resin.

The present invention provides a positive photosensitive resin composition comprising a polyimide resin having a structural unit represented by the formula (1) and a structural unit represented by the formula (2), a quinonediazide sulfonate, a thermal curing agent and a thermal acid generator.

In the formulae (1) and (2), n is an integer of 10 to 600, $Ar_1$ is a tetravalent organic group, $Ar_2$ is a divalent to tetravalent organic group, $Ar_3$ is a divalent aromatic group, and $R_1$ is an OH group or a COOH group.

In an embodiment of the present invention, the quinonediazide sulfonate is 10-30 parts by weight relative to 100 parts by weight of the polyimide resin.

In an embodiment of the present invention, the thermal curing agent is 10 to 50 parts by weight relative to 100 parts by weight of the polyimide resin.

In an embodiment of the present invention, the thermal curing agent may include an epoxy compound and a melamine compound. The weight ratio of the epoxy compound to the melamine compound may be 3:1 to 4:3.

In an embodiment of the present invention, the thermal acid generator is an onium sulfonium salt.

In an embodiment of the present invention, the thermal acid generator is 1 to 5 parts by weight relative to 100 parts by weight of the polyimide resin.

In an embodiment of the present invention, the onium sulfonium salt is selected from at least one of the group consisting of chloride, bromide, p-toluenesulfonate, trifluoromethanesulfonate, tetrafluoroborate, tetrakis(pentafluorophenyl)borate, tetrakis(pentafluorophenyl)ruthenate, hexafluorophosphate, hexafluoroarsenate, and hexafluoroantimonate.

The present invention also provides a photoresist film made of the above photosensitive polyimide composition.

Other objectives, features and advantages of the present invention will be further understood from the further technological features disclosed by the embodiments of the present invention wherein there are shown and described preferred embodiments of this invention, simply by way of illustration of modes best suited to carry out the invention.

DETAILED DESCRIPTION OF PREFERRED EMBODIMENTS

The photosensitive polyimide composition provided by the present invention is a positive photosensitive resin composition mainly comprising a polyimide resin, a quinonediazide sulfonate as a sensitizer, a thermal curing agent and a thermal acid generator. Such a composition not only has heat resistance after hard baking, but also has good chemical resistance, and can better meet the requirements for the manufacture of the insulating layer required by a particular specification.

The polyimide resin used in the present invention preferably has a structural unit represented by the formula (1) and a structural unit represented by the formula (2).

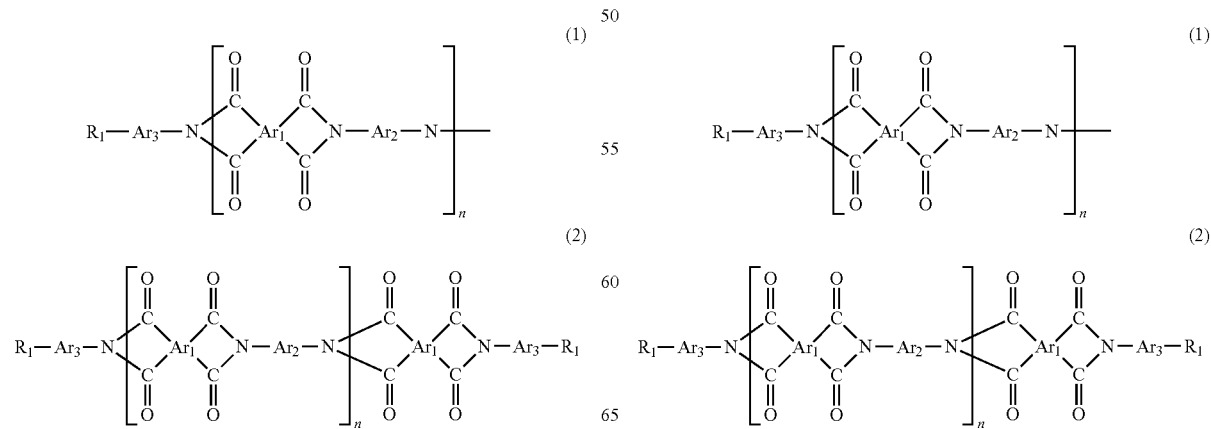

In the formulas (1) and (2), n is an integer of 10 to 600, the polyimide resin has a molecular weight in the range of 5000-50000, $Ar_t$ is a tetravalent organic group, and $Ar_2$ is a divalent to tetravalent organic group; $Ar_3$ is a divalent aromatic group and $R_1$ is an OH group or a COOH group. $Ar_1$ is

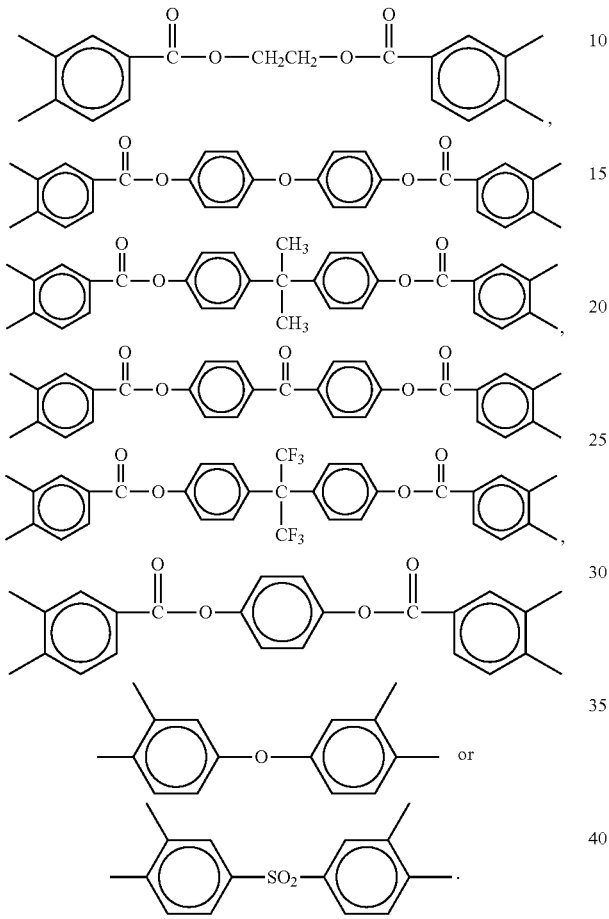

$Ar_2$ is

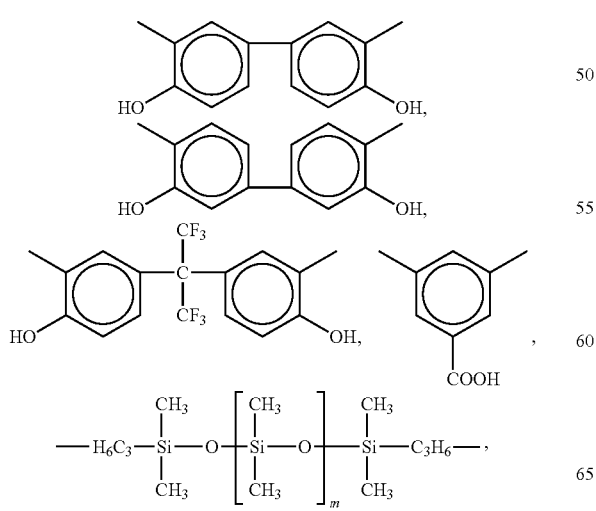

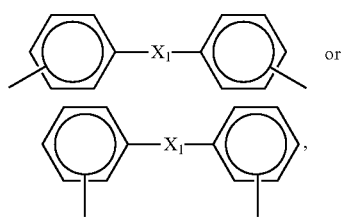

wherein m is an integer of 1 to 20, and $X_1$ is

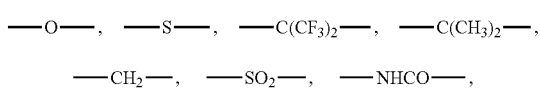

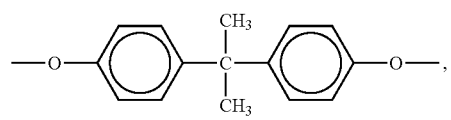

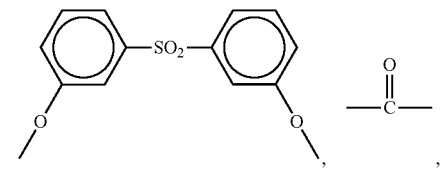

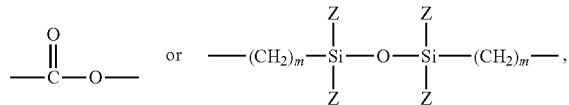

wherein m is an integer of 1 to 20, and Z is a H atom or a methyl group.

$Ar_3$ is

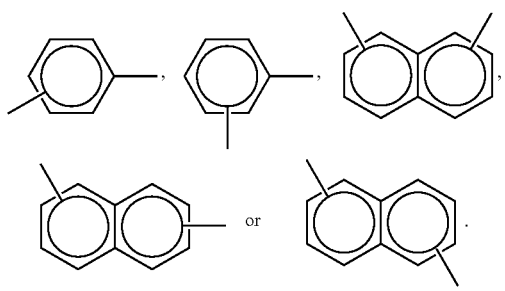

For example, the polyimide resin of the present invention is preferably a chemical formula of the following formula (3), wherein n is an integer of 10 to 600:

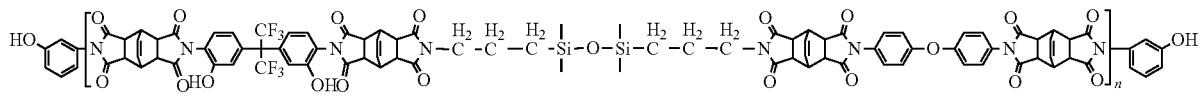

(3)

The sensitizer used in the present invention may be a quinonediazide sulfonate such as diazonaphthoquinone. The quinonediazide sulfonate is 10-30 parts by weight with respect to 100 parts by weight of the polyimide resin.

The amount of the thermal curing agent to be compounded is preferably 10 to 50 parts by weight, and particularly preferably 20 to 30 parts by weight with respect to 100 parts by weight of the polyimide resin. The thermal curing agent may include an epoxy compound and a melamine compound. The weight ratio of the epoxy compound to the melamine compound may be 3:1 to 4:3.

The melamine compound may be, but is not limited to, one or a combination of two or more of melamine, hexamethylol melamine hexamethyl ether, hexamethylol melamine hexabutyl ether, tetramethoxymethylbenzoguanamine, tetrabutoxylabenzobenzamide and the like. Melamine is preferred.

The epoxy compound may be, but not limited to, one or a combination of novolac type epoxy resins; triphenylmethane type epoxy resins such as bisphenol A diglycidyl ether, bisphenol F diglycidyl ether, and trisphenol propane triglycidyl ether, etc.; aliphatic type epoxy resins such as 3,4-epoxycyclohexylmethyl-3,4-epoxycyclohexane carboxylates, etc.; dihydrate glycidyl ester resins such as diglycidyl phthalate, diglycidylhexahydrophthalate, and dimethyl glycidyl phthalate etc., glycidyl amine resins such as tetraglycidyl-diaminodiphenylmethane, triglycidyl-p-aminophenol, diglycidylaniline, diglycidyltoluidine, tetraglycidylbisaminomethylcyclohexane, and the like. Triglycidyl p-aminophenol and bisphenol A diglycidyl ether are preferred.

One of the important characteristics of the photosensitive polyimide composition of the present invention is the addition of a thermal acid generator. The hot acid generator may be an onium sulfonium salt. In terms of the compounding amount, the thermal acid generator may account for about 1 to 5 parts by weight relative to 100 parts by weight of the polyimide resin. In an embodiment, the onium sulfonium salt may be selected from but not limited to at least one of chloride, bromide, p-toluenesulfonate, trifluoromethanesulfonate, tetrafluoroborate, tetrakis(pentafluorophenyl)borate, tetrakis(pentafluorophenyl)ruthenate, hexafluorophosphate, hexafluoroarsenate, and hexafluoroantimonate. Hexafluorophosphate and tetrakis(pentafluorophenyl)borate are preferred.

The respective components of the above composition are soluble in organic solvents. The organic solvent may be but not limited to gamma-butyrolactone (GBL), and its weight accounts for about 55%-85% of the total weight of the positive photosensitive polyimide composition of the present invention. Organic solvent may also be the polar organic solvents with strong dissolving power, such as N-methylpyrrolidone, dimethylacetoamide, methylformamide, etc., which are often used in the industry. The imide resin, which is only soluble in a nitrogen-containing polar solvent such as N-methylpyrrolidone, suffers from problems such as whitening caused by moisture absorption, and the storage stability is insufficient. Therefore, the coating film (thin film) obtained using this resin has a problem that it is impossible to obtain a tough coating film, excellent electric characteristics, and the like that the imide resin originally has. Therefore, an imide resin that is soluble in an organic solvent such as γ-butyrolactone, which has a relatively weak dissolving power, is more preferable.

The photosensitive polyimide composition of the present invention may be in the form of a solution as described above, and may be a photoresist film obtained by pre-baking, exposing, developing, post-baking, etc. About 1 μm~10 μm. Pre-baking temperature is about 100° C.~120° C., post-baking temperature is about 200° C.~250° C. The photosensitive polyimide composition solution of the present invention is prepared by first preparing an appropriate amount of a polyimide solution, adding a desired photosensitizer, a thermal curing agent, and a thermal acid generator, and adding a solvent to dilute the photosensitive polyimide composition solution to a desired concentration for subsequent use. It should be noted that the photoresist film mentioned herein is generally referred to as an insulating layer or a protective layer in a semiconductor device, and is particularly applicable to alkaline water-soluble development, and can be widely used in the semiconductor and display industries, chip packaging, display insulations and IC wafer protection/passivation layers.

Preparation Example of Polyimide Resin

A three-necked round-bottom flask of 1000 ml equipped with a mechanical stirrer and a nitrogen inlet was used, and 18.3 g (50 mmol) of hexafluoro-2,2-bis(3-amino-4-hydroxyphenyl), 12.3 g (30 mmol) of 2,2-bis(4-(4-aminophenoxy)phenyl)propane, 2.02 g (10 mmol) of 4,4'-oxydianiline (4,4'-Oxydianiline), 20.5 g (50 mmol) TMEG(ethylene glycol bis(4-trimellitate anhydride)) and 15.5 g (50 mmol) of bis(3,4-dicarboxyphenyl) ether dianhydride and 400 g of N-methyl-2-pyrrolidone solvent were added. After stirring the above solution at 0° C. for 4 hours, 2.18 g (20 mmol) of blocking agent (3-aminophenol) was added, and the mixture was stirred at room temperature for 4 hours, and then 80 g of dimethylbenzene was added. The mixture was then heated to 180° C. and stirred for 3 hours. After cooling, a viscous polyimide resin can be obtained.

The photosensitive polyimide compositions of Examples 1 to 3 and Comparative examples 1 to 4 were prepared at the formulation ratios of Table 1 taken from 100 parts by weight of the aforementioned polyimide resin. In order to verify the chemical resistance and the insulating property of the photoresist film made of the photosensitive polyimide composition of the present invention, various compositions were prepared under the process conditions of Table 2 to form photoresist films for chemical resistance tests and insulation tests. Wherein, TMAH 2.38 wt % is the concentration of tetramethylammonium hydroxide as a developer.

TABLE 1

| | Alkali soluble resin | Sensitizer | Thermal Curing Agent-1 | Thermal Curing Agent-2 | Thermal Acid Generator | Solvent |
|---|---|---|---|---|---|---|
| Embodiment 1 | Polyimide resin 100% | Diazonaphthoquinone 20% | Melamine 5% | Triglycidyl p-aminophenol 15% | SIB3 1% | γ-butyrolactone |
| Embodiment 2 | Polyimide resin 100% | Diazonaphthoquinone 20% | Melamine 5% | Bisphenol A diglycidyl ether 15% | SIB3 1% | γ-butyrolactone |
| Embodiment 3 | Polyimide resin 100% | Diazonaphthoquinone 20% | Melamine 5% | Triglycidyl p-aminophenol 15% | Hexafluorophosphate 1% | γ-butyrolactone |
| Comparative example 1 | Phenolic resin 100% | Diazonaphthoquinone 20% | Melamine 5% | Triglycidyl p-aminophenol 15% | SIB3 1% | γ-butyrolactone |
| Comparative example 2 | Polyimide resin 100% | Diazonaphthoquinone 20% | Melamine 5% | Triglycidyl p-aminophenol 15% | NA | γ-butyrolactone |
| Comparative example 3 | Polyimide resin 100% | Diazonaphthoquinone 20% | Melamine 20% | NA | SIB3 1% | γ-butyrolactone |
| Comparative example 4 | Polyimide resin 100% | Diazonaphthoquinone 20% | NA | Triglycidyl p-aminophenol 20% | SIB3 1% | γ-butyrolactone |

Chemical Resistance Test Procedure

The photoresist film prepared by the above process is first measured for film thickness ($T_0$), the post-baked photoresist film is immersed in 25° C., 75% concentrated nitric acid for 1 minute, and then immersed in acetone at 25° C. for 20 minutes. Re-immersion in 25° C., 75% concentrated nitric acid for 1 minute, measure the film thickness ($T_A$), observe the residual film rate ($T_A/T_0$), wherein the residual film rate is the ratio of the residual film thickness after the end of the resistance test to the film thickness after the pre-baking process. The results of the resistance test of the photoresist films made of various composition compositions are shown in Table 3, wherein SIB3 represents tetrakis(pentafluorophenyl)borate.

Insulation Test

Using a 4339B high resistance meter (manufactured by Agilent), the surface resistance value (Ω) of the photoresist film prepared by the above process, represented by $R_S$, and the volume resistance value (Ω), expressed by $R_V$, were measured. The results are shown in Table 3 below.

TABLE 2

| Thickness | Pre-baking | Exposure | Development | Post-baking |
|---|---|---|---|---|
| 2.5 μm | 100° C./ 2 mins | 150 mJ | 30 sec (TMAH 2.38 wt %) | 200° C./ 1 hour |

TABLE 3

| | Residual film rate | $R_s$ | $R_v$ |
|---|---|---|---|
| Embodiment 1 | 96.3% | 6.37E+16 | 3.25E+17 |
| Embodiment 2 | 96.0% | 5.98E+16 | 2.74E+17 |
| Embodiment 3 | 97.6% | 6.51E+16 | 3.83E+17 |
| Comparative example 1 | 70.3% | 4.73E+16 | 1.55E+17 |
| Comparative example 2 | 63.5% | 3.91E+16 | 1.47E+17 |
| Comparative example 3 | 51.9% | 3.51E+16 | 2.06E+17 |
| Comparative example 4 | 75.2% | 4.82E+16 | 1.89E+17 |

The above test proves that the photoresist film made of the photosensitive polyimide composition of the present invention has excellent chemical resistance, in which the proper selection and blending of the thermal curing agent and the thermal acid generator are more effective in helping to increase the chemical resistance of the photoresist film.

In summary, the present invention provides a positive photosensitive polyimide composition that can be used for alkaline water-soluble development, and can be widely used in the semiconductor and display industries, chip packaging, display insulation layer and protective layers for IC chips. It has high sensitivity, good resolution, low hard-baking temperature, high film thickness retention rate, high solvent resistance, and also has excellent thermal stability and good mechanical, electrical and chemical properties, a higher product yield compared to polyamide, and can simplify the process and reduce costs.

Although the present invention has been disclosed in the above preferred embodiments, it is not intended to limit the present invention. Any person skilled in the art can make some changes and modifications without departing from the spirit and scope of the present invention. The scope of protection shall be subject to the definition of the appended application.

What is claimed is:

1. A photosensitive polyimide composition comprising a polyimide resin having a structural unit represented by the formula (1) and a structural unit represented by the formula (2), an quinonediazide sulfonate, a thermal curing agent, and a thermal acid generator,

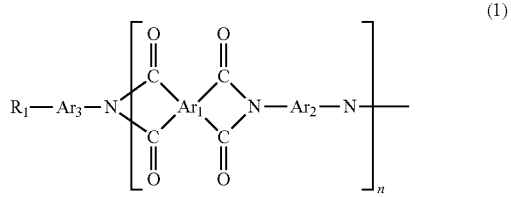

-continued (2)

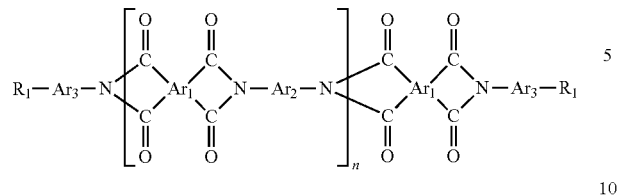

wherein in the formulae (1) and (2), n is an integer of 10 to 600, $Ar_1$ is a tetravalent organic group, $Ar_2$ is a divalent to tetravalent organic group, $Ar_3$ is a divalent aromatic group, and R1 is an OH group or a COOH group; the thermal curing agent comprises an epoxy compound and a melamine compound, and the weight ratio of the epoxy compound to the melamine compound is 3:1 to 4:3;

wherein the photoresist film has properties of chemical resistance and insulation, and the property of chemical resistance is expressed by a residual film rate of greater than 90%;

wherein the thermal acid generator is an onium sulfonium salt selected from at least one of the group consisting of chloride, bromide, p-toluenesulfonate, trifluoromethanesulfonate, tetrafluoroborate, tetrakis(pentafluorophenyl)borate, tetrakis(pentafluorophenyl)ruthenate, hexafluorophosphate, hexafluoroarsenate, and hexafluoroantimonate.

2. The photosensitive polyimide composition according to claim 1, wherein the quinonediazide sulfonate is 10-30 parts by weight relative to 100 parts by weight of the polyimide resin.

3. The photosensitive polyimide composition according to claim 1, wherein the thermal curing agent is 10 to 50 parts by weight relative to 100 parts by weight of the polyimide resin.

4. The photosensitive polyimide composition according to claim 1, wherein the thermal acid generator is 1 to 5 parts by weight relative to 100 parts by weight of the polyimide resin.

5. The photosensitive polyimide composition according to claim 1, wherein the polyimide resin has a structure represented by formula (3), (3)

wherein in formula (3), n is an integer of 10 to 600.

6. A method of manufacturing a photoresist film, comprising:
    applying the photosensitive polyimide composition as described in claim 1 to a substrate;
    exposing the photosensitive polyimide composition; and
    executing a developing process.

7. The method for producing a photoresist film according to claim 6, wherein a pre-baking is further performed at 100° C. to 120° C. before exposing the photosensitive polyimide composition.

8. The method for producing a photoresist film according to claim 6, further comprising a post-baking at 200° C. to 250° C. after the developing process.

* * * * *